(12) United States Patent
Testa et al.

(10) Patent No.: US 6,205,407 B1
(45) Date of Patent: Mar. 20, 2001

(54) SYSTEM AND METHOD FOR GENERATING TEST PROGRAM CODE SIMULTANEOUSLY WITH DATA PRODUCED BY ATPG OR SIMULATION PATTERN CAPTURE PROGRAM

(75) Inventors: Louis C. Testa; Susan P. Geiger, both of Beaverton, OR (US)

(73) Assignee: Integrated Measurement Systems, Inc., Beaverton, OR (US)

( * ) Notice: Subject to any disclaimer, the term of this patent is extended or adjusted under 35 U.S.C. 154(b) by 0 days.

(21) Appl. No.: 09/031,142

(22) Filed: Feb. 26, 1998

(51) Int. Cl.[7] .................................................. G01R 31/28
(52) U.S. Cl. ................................... 702/119; 717/5; 716/4
(58) Field of Search .............................. 702/119, 123; 716/4, 5, 6; 714/724; 717/5, 7

(56) References Cited

U.S. PATENT DOCUMENTS

| 5,446,742 | * | 8/1995 | Vahabi et al. ............................ 371/27 |
| 5,668,745 | * | 9/1997 | Day .......................................... 364/480 |
| 5,778,004 | * | 7/1998 | Jennion et al. ...................... 371/22.1 |
| 5,845,234 | * | 12/1998 | Testa et al. ............................ 702/119 |
| 5,974,248 | * | 10/1999 | Graef ................................... 395/500.43 |
| 6,067,652 | * | 5/2000 | Fusco et al. .......................... 714/741 |

* cited by examiner

*Primary Examiner*—Patrick Assouad
(74) *Attorney, Agent, or Firm*—Marger Johnson & McCollom, P.C.

(57) ABSTRACT

A system and method of generating test code for testing an electronic device on an Automatic Test Equipment (ATE) platform are described. The invention translates scan and pattern test data into test code based upon user defined settings. The test data preferably comes from a test data generation program such as a Scan ATPG or Simulation program, which generates test data. The test data is serially streamed to the invention by the use of function calls embedded in the test data generation program. The user, preferably using a Graphical User Interface (GUI), defines the desired ATE platform type, as well as other custom format features for the output data. The translation, preferably running simultaneously with the test data generation plan, produces the test code as the test data is generated. The user also has the option to generate several different versions of test code simultaneously from the same generation of the test data. The user also may define substitution tables to substitute test data characters for selected data patterns to create test code optimal for a specific ATE platform.

18 Claims, 7 Drawing Sheets

| TABLE NAME: A | | |
|---|---|---|
| DEFINITION | GENERIC | MAPPED |
| FORCE TO 0 | 0 | 0 |
| FORCE TO 1 | 1 | 1 |
| FORCE HIZ | Z | z |
| COMPARE HIGH | H | h |
| COMPARE LOW | L | l |
| COMPARE HIZ | T | M |
| MASK COMPARE, DON'T DRIVE | X | x |
| DATA MISSING | ? | x |
| USE LAST VALUE | . | - |
| HEX GROUP DATA FOLLOWS | | .x |
| OCTAL GROUP DATA FOLLOWS | | .o |
| DECIMAL GROUP DATA FOLLOWS | | .d |

FIG. 7

| PATTERN DATA TYPE → ↓ SIGNAL | ALL | READ | WRITE | IDLE |
|---|---|---|---|---|
| SIG 4 | | A | C | B |
| GROUP5 | A | A | A | A |
| SIG 2 | A | A | A | A |
| SIG 3 | | A | C | B |

FIG. 8

SYSTEM AND METHOD FOR GENERATING TEST PROGRAM CODE SIMULTANEOUSLY WITH DATA PRODUCED BY ATPG OR SIMULATION PATTERN CAPTURE PROGRAM

RELATED APPLICATION DATA

This application is related to commonly-assigned U.S. patent application Ser. No. 08/844,807, filed Apr. 22, 1997, U.S. Pat. No. 5,845,234 for SYSTEM AND METHOD FOR EFFICIENTLY GENERATING TESTING PROGRAM CODE FOR USE IN AUTOMATIC TEST EQUIPMENT.

BACKGROUND OF THE INVENTION

This invention relates generally to automatic test equipment and more particularly to a system and method for efficiently generating a test program for use in automatic test equipment.

Digital integrated circuits, such as microprocessors and application specific integrated circuits (ASICs) require substantial testing to ensure high quality and performance with low defect levels. During electronic circuit design, the testing of these devices is generally performed by automatic test equipment (ATE) which performs the testing under the control of a test program. The data for the test program can originate from several sources including scan and pattern data extracted from a design simulation program or from scan based automatic test program generation (ATPG).

A variety of commercial companies offer test data generation programs, either ATPG programs or design simulation programs. Since there are a variety of test program formats, most test data generation programs output to the intermediate format of a waveform language (the intermediate waveform format) instead of to the many different test program formats. It then becomes the user's problem to find a method of translating the intermediate waveform format into the format required for the test program. Getting the data from the source form to the ATE requires complicated data manipulation and often, custom programming, all of which requires large amounts of time and disk space.

Existing methods use the intermediate waveform format for two reasons. First, an intermediate waveform format conventionally provides a common starting point for all translations to all ATE formats. Second, existing methods presume that the translator needs to make many passes over the source test data to create the format required for the ATE. Therefore, existing methods presume a need for an intermediate data structure, such as the intermediate waveform, that contains all the source test data.

Existing methods treat the process of generating a test program from source test data as a multi-step process: first generating the intermediate waveform and then translating. Often, the translating step has multiple sub-steps that also operate serially, requiring each sub-step to be completed prior to the next sub-step.

There are a number of disadvantages with this approach. First, this process is slow. It requires that the test data generation program first create the intermediate waveform format which is separately run through a translator. Each step in this process can take hours for a state-of-the-art integrated circuit. Second, the intermediate waveform format consumes a considerable amount of disk space. The size of these files can quickly fill up disk drives of modern computers. The intermediate waveform format is often thrown away after the translation, making this a wasteful and inconvenient step.

When going from the intermediate waveform format to the test program, current methods require using or writing a separate translator for every ATE format. Typically, this translator is written by a test engineer, though there are commercial programs available to translate from the intermediate waveform format to an test program. But existing translation methods require a different translation program for each ATE format and follow the known methodology of making multiple passes over an intermediate waveform format.

Existing programs are inflexible and do not allow for an automatic way to go from the source test data all the way to the test program in one process.

Therefore, there is a need for a flexible system and method for automatically generating a test program from source test data.

Further, there is a need to automatically translate source test data without writing a separate translator for every ATE format.

Additionally, it is desirable to be able to run a test data generation program, such as a Scan ATPG or a Simulation program, and concurrently translate the data into a test program, thereby saving large amounts of both time and disk space.

SUMMARY OF INVENTION

The invention provides a flexible and efficient system and method for generating a test program for use in automatic test equipment. According to the invention, this is accomplished by a software program (the translator program) which requires two inputs: a setup control file and a data stream of source test data.

The invention enables the user to specify a setup control file to define information to the translator in advance, such as the target ATE platform, the desired format of the test program and desired run time warnings. This definition is accomplished by use of a setup control mechanism, preferably a Graphical User Interface (GUI), that allows the user to select the target ATE (such as the IMS ATS and the Teradyne J971) as well as a variety of other characteristic information to customize the test program. The selection can also be done by any variety of user input methodologies, such as a conventional User Interface(UI) or by inputting a list of settings. Once the user has defined the system setup file, that file may be stored and reused or revised in future test program generations.

Second, a data stream of source test data is input into the translator program. This invention is flexible to accept source test data generated from a test data generation program, such as a scan ATPG or a simulation program, or from an existing test data file, generated previously. The invention is also flexible to allow different configurations of the testing system. For example, the ATPG program can run on the same processor or on a different processor than the translator program.

Preferably, the source test data is streamed serially into the translator as it is generated by the test data generation program. Alternately, the input is streamed serially from an existing test data file. Streaming the data in serially allows for a significant benefit of this invention: concurrent translation of the source test data into an ATE format while the source test data is being generated by the test data generation program. Under this scenario, the source test data is coming from a test data generation program, either a Scan ATPG program(such as View Logic, Mentor Graphics and Synopsis) or a capture from a design simulation program (such as Cadence Verilog XL). By running the test data generation program and streaming the data to the translator program to receive and process concurrently, there is no need for the large memory-consuming intermediate waveform format.

Further, if the test data generation program and the translation program run on separate microprocessors, there is the additional benefit of a large time savings of doing these tasks concurrently rather than one step at a time. The test program is generated in essentially the same amount of time as it takes the test data generation program to generate the source test data.

The inputting of source test data is different from the prior art in several ways. Prior art translators read a file containing the source test data in the waveform intermediate format. The translator has access to the entire file at all times and often makes several passes over the data. This invention takes data, either from a source test generation program or from an existing file, and marks the scan (serial) and pattern (parallel) data of the source test data. The only data that is important to the translator in this invention is the scan and pattern data. The other data conventionally found in the source test data, such as waveform and timing data, is ignored by the invention. The source test data, including the scan and pattern data, is streamed to the translator. The translator processes each unit of data only once, as it is streamed in. When using a source test generation program, this invention accomplishes this single-pass processing by utilizing function calls linked directly into the source test generation program. When using an existing test data file, this invention uses a parser program to stream the data as if it was being generated by a test data generation program.

The translator program takes the input of the streamed-in source test data and transforms it into a test program in accordance with the parameters in the setup control file. By accepting only one unit of source test data at a time, the translator program generates test code without making multiple passes over an entire data structure, as was done in the prior art. This is possible due to three innovative realizations. First, the translator can utilize a series of buffers to collect input data to allow for transformation of a group of data into test code. This buffer series eliminates the need to do multiple passes over the source test data to group together related data. Second, the invention ignores the components of source test data that define the sequences of waveform templates used to set ATE timing or formats in conventional translators. By doing so, the translator can process the remaining source test data as it is streamed in. Third, to accommodate test program formats that allow waveform template data to be embedded in the pattern data, the invention allows for user definition of character set maps. These character set maps define substitution characters that embed waveform template data into the parallel data on a signal and pattern data type basis.

In the intermediate waveform format used by conventional systems, waveform templates are used to set ATE timing or formats. To avoid the multi-pass processing of the source test data required to process the waveform template data, this invention ignores the waveform templates and instead gets the waveform templates from a data file. The user can select a data file containing the desired waveform templates by using the setup control mechanism.

Some ATE platforms allow the waveform template data to be embedded in a unit of pattern data. Prior art translators, with full access to all data at all times could make these substitutions to meet the needs of the ATE. In this invention, data is streamed in, so this power is now given to the user to define. The user may define for any pin signal of any pattern data type, a character set which defines a substitution of one character for another based on a table. These character sets allow the user to embed waveform template data into pattern data. There are examples of character substitution tables in the prior art, but novel to this invention is the use of a table to substitute characters for any pin signal of any pattern data type.

Another aspect of this invention is the ability to generate more than one output test program from one execution of the invention. The user may select several test program formats on the setup control mechanism. The invention launches several parallel translation processes or instances, one for each desired output, each producing a different test program from the same source test data and setup control file. The output test programs may be ATE programs that can run on a specific ATE or target output program, used for other test purposes such as re-simulation or providing a readable format for the tester to follow.

The foregoing and other objects, features and advantages of the invention will become more readily apparent from the following detailed description of a preferred embodiment of the invention which proceeds with reference to the accompanying drawings.

Figure 1:
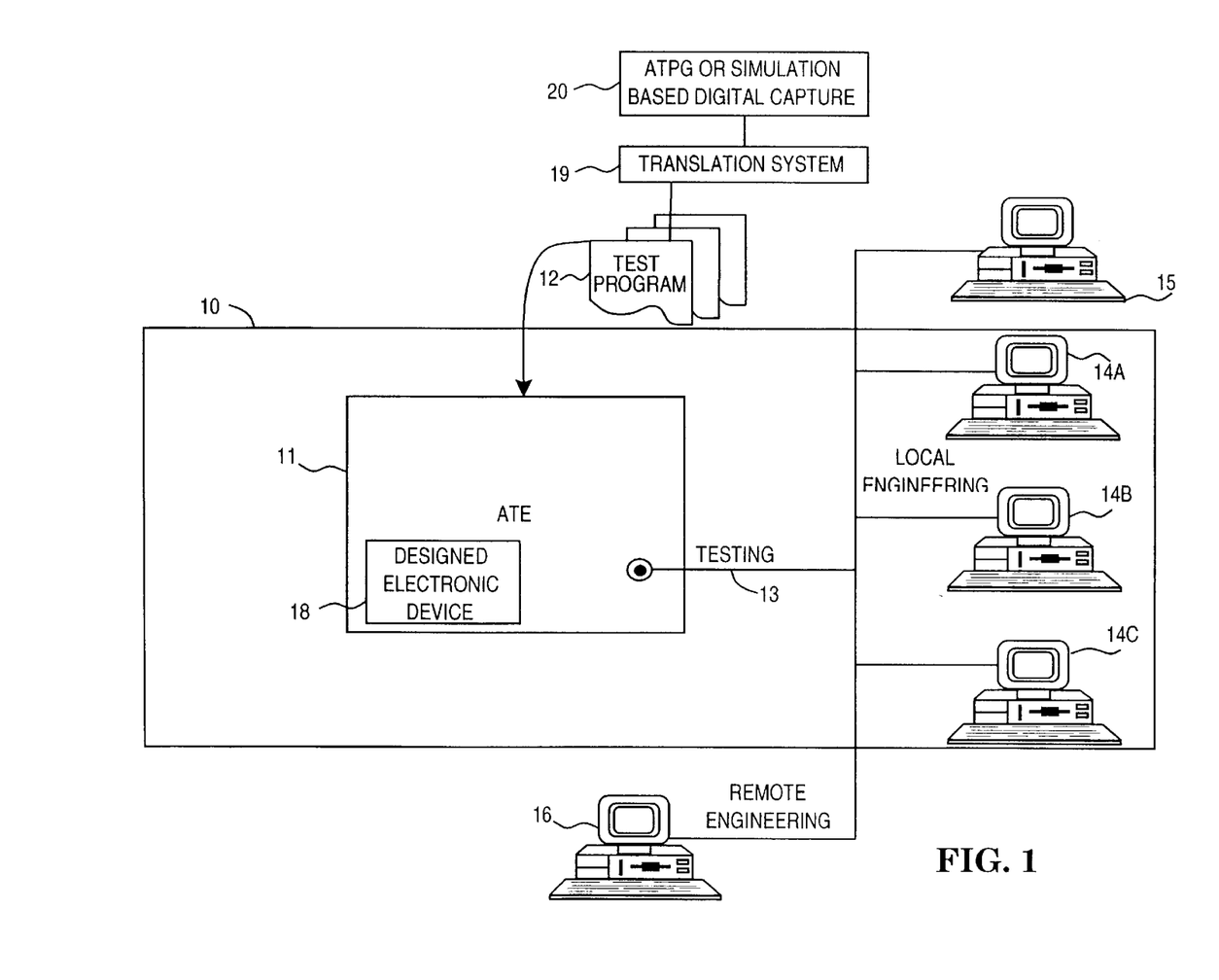
FIG. 1 is a block diagram of an example system for generating, translating and using test program code for use in automatic test equipment according to the present invention.

DETAILED DESCRIPTION 1.0 Overview
2.0 Setup Control Mechanism
   2.1 Contents of the Setup Control File
      2.1.1 Input Source
      2.1.2 ATE Selection
      2.1.3 Data Capture Range
      2.1.4 Pattern Row Processing
      2.1.5 Run Time Rule Checks
      2.1.6 Program Layout
      2.1.7 Signal to ATE Channel Map
      2.1.8 Output Format
      2.1.9 Column Order
      2.1.10 Name Map
      2.1.11 Character Set Map 3.0 Generation of Input Stream
   3.1 Origin of the data
   3.2 Interface Routines
   3.3 The Parser Function
4.0 Translation to Output
   4.1 The Translator
      4.1.1 Start
      4.1.2 Parallel Setup
      4.1.3 Parallel Row Data
         4.1.3.1 Map Waveform Template Names
         4.1.3.2 Repeat Identification
         4.1.3.3 Grouping And Ordering
         4.1.3.4 Map Parallel Characters
         4.1.3.5 Line Format
         4.1.3.6 Program Assembly Control
      4.1.4 Serial Setup
      4.1.5 Serial Data
      4.1.6 End
   4.2 Output
1.0 Overview FIG. 1 is a block diagram of an example system 10 for using test program code to test a designed electronic device 16 in automatic test equipment (ATE) 11 according to the present invention. Conventional ATE 11, such as the MTS Advanced Test Station series, manufactured and licensed by Integrated Measurement Systems (IMS) of Beaverton, Oreg., test modern electronic devices under the control of test programs 12, each test program 12 comprising test program code. The test programs 12 are generated, as further described below with reference to FIG. 3 et. seq., on an engineering workstation 15 physically interconnected with (or interconnectable to) the ATE 11 using data generated by a test data generation program such as a scan automatic test program generation (scan ATPG) or a design-based simulation.

The test workstation 15 can generate test programs 12 for several different types of ATE 11 platforms. Prior to testing, the user selects an ATE 11 platform and the desired characteristics for the test program 12. The test workstation 15 generates the ATE-specific test program 12 for the selected ATE platform from the data generated by a test data generation program. The test program 12 is loaded into the ATE 11 which then tests the designed electronic device according to the test program 12. The ATE 11 can be controlled via communications 13 by the test workstation 15 which also displays the results of the test. The test workstation 15 is a conventional computer, including a processor, memory and input/output facilities.

FIG. 1 also shows where the invention fits into such a system. The ATPG or simulation based digital capture program 20 creates data that is translated by the translation system 19 of the present invention into one or several test programs 12.

Figure 2:
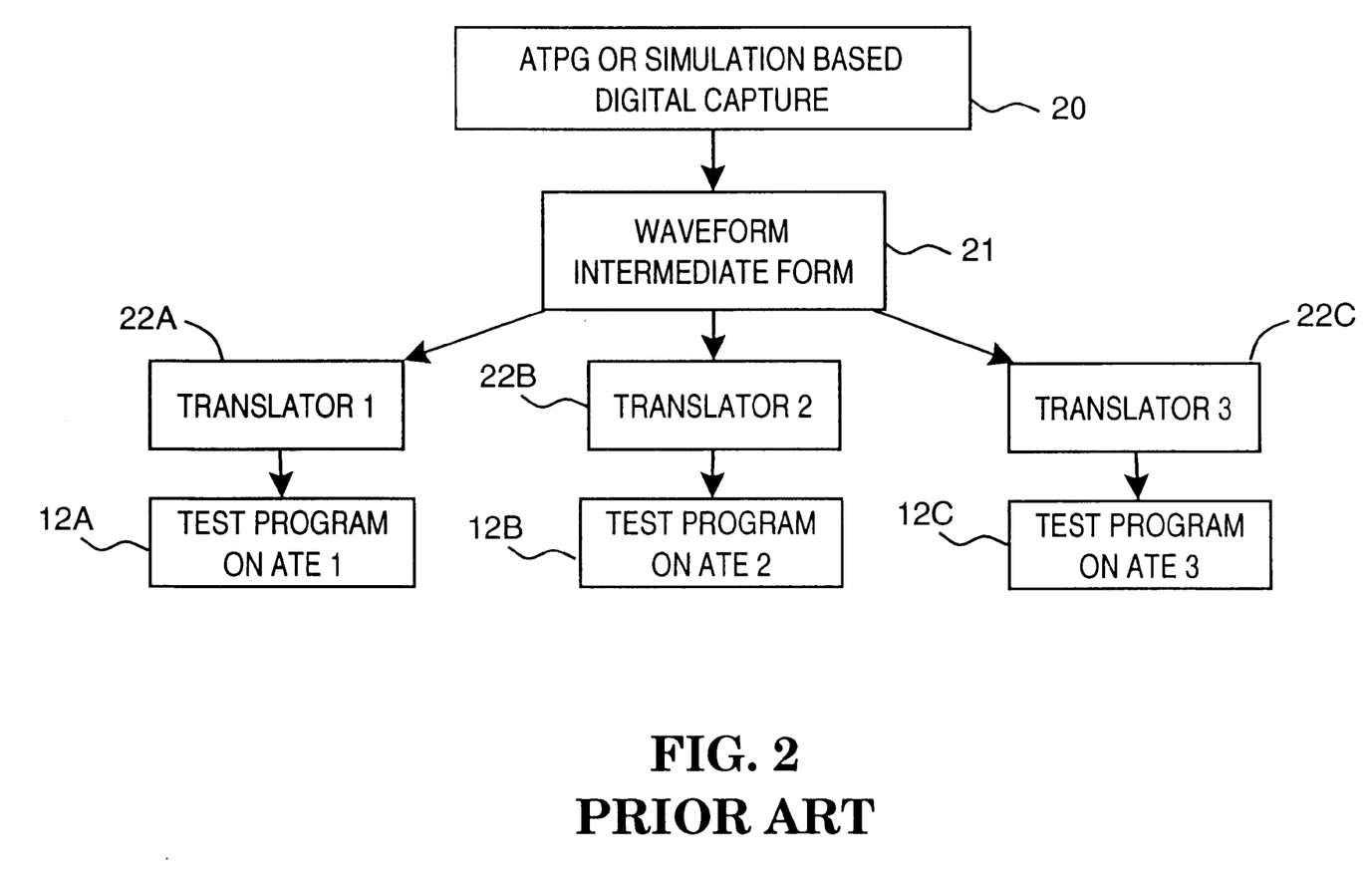
FIG. 2 is a flow diagram of a prior art method for generating test program code for use in automatic test equipment.

FIG. 2 is a flow diagram of a standard prior art method for generating test program code for use in automatic test equipment. The starting point is either an ATPG or simulation based capture program 20 which outputs test data in a cyclized waveform format 21. Separate translators 22A–C must be written to generate a test program 12A–C that will run on a particular ATE.

Figure 4:
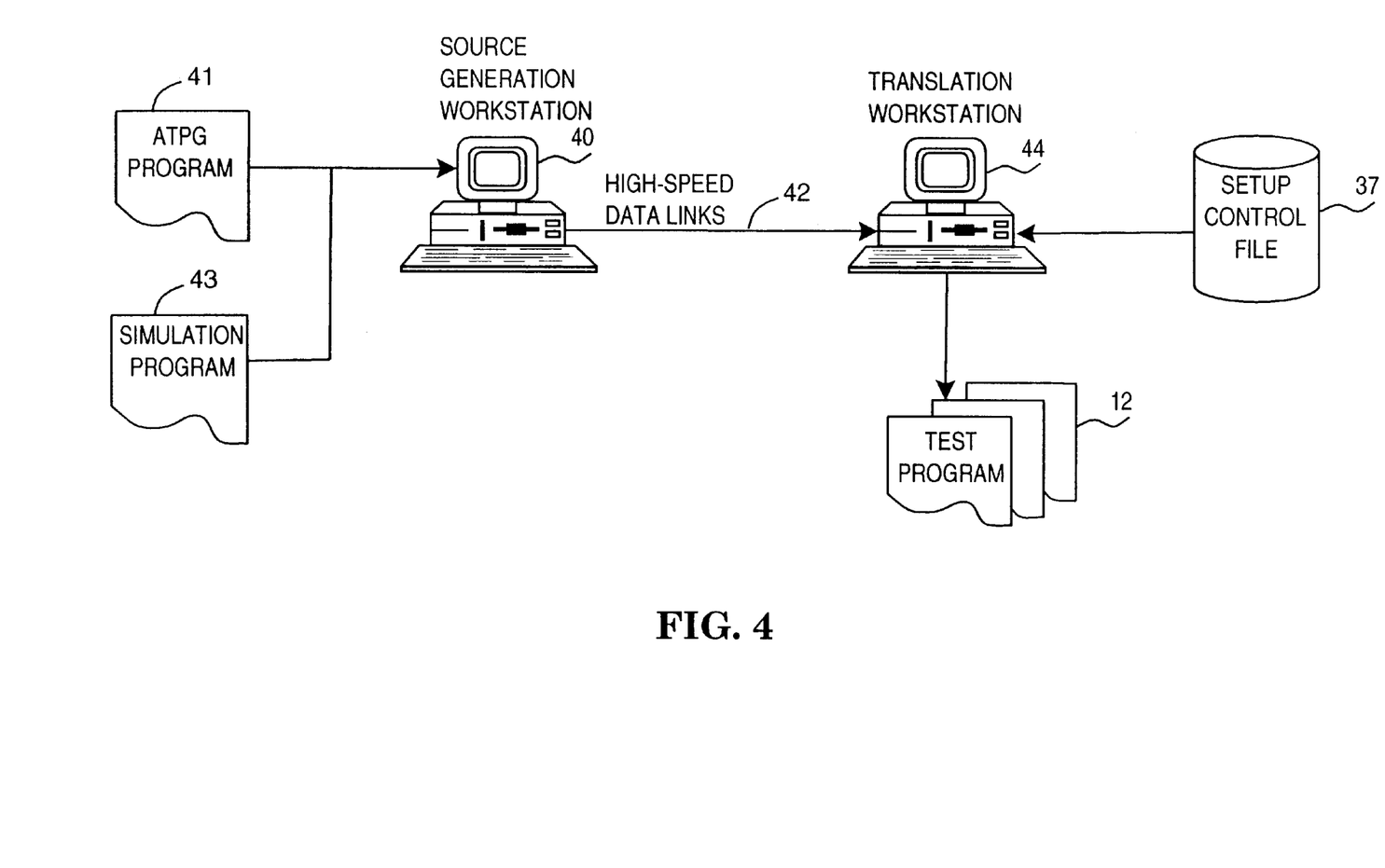
FIG. 4 is a block diagram of the preferred system setup according to the present invention.

FIG. 4 is a block diagram of the preferred system setup according to the present invention. One workstation, the source generation workstation 40, will execute either an ATPG 41 program or a simulation program 43 to generate test data. The test data will be transmitted on a high-speed data link 42 to the translation workstation 44. The translation workstation 44 will generate one or more test programs 12 based on the configuration given in the setup control file 37. Under this two-workstation system, the translation workstation 44 can translate simultaneously as the test data is generated by the source generation workstation 40.

Figure 3:
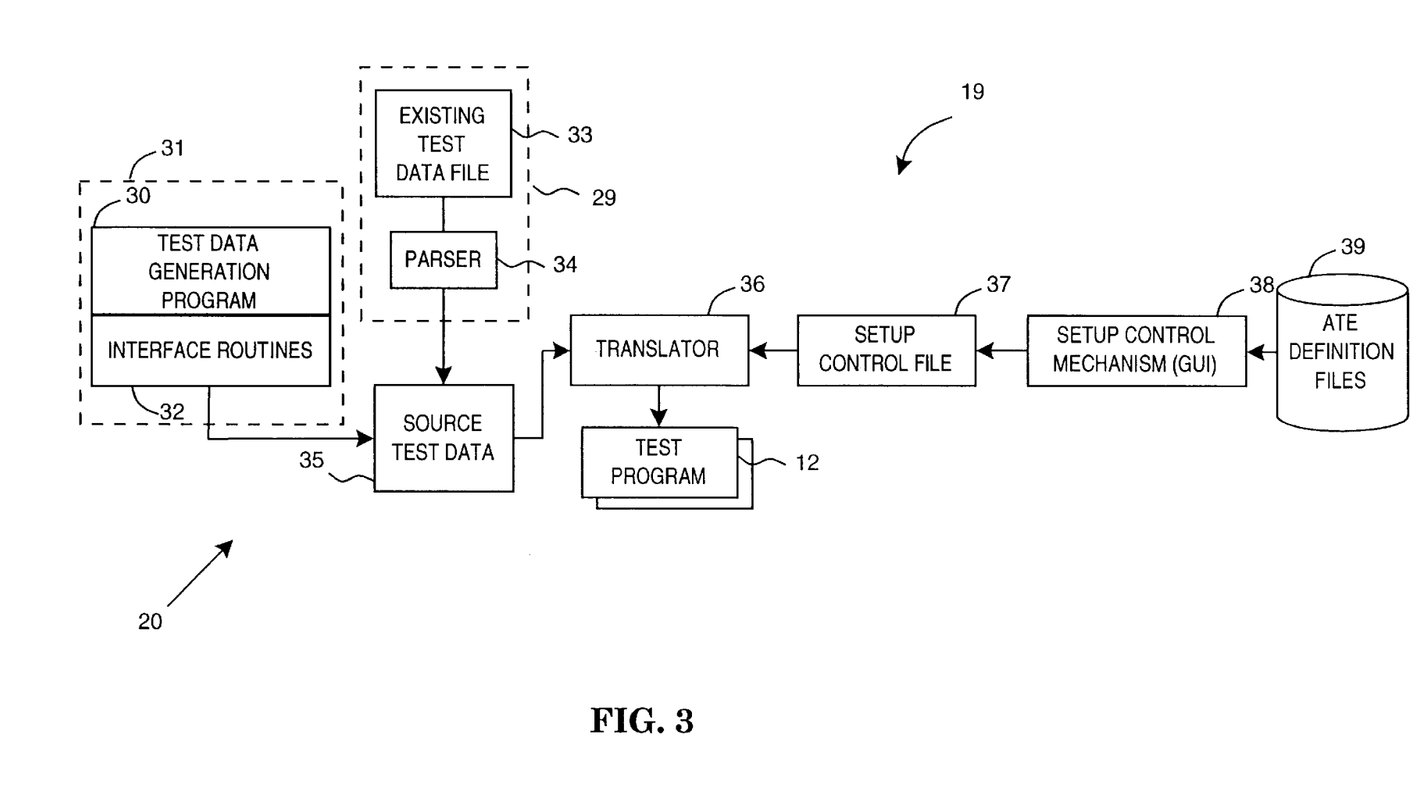
FIG. 3 is a flow diagram of a method for generating test program code for use in automatic test equipment according to the present invention.

FIG. 3 is a flow diagram of a method for generating testing program code for use in automatic test equipment according to the present invention. The invention comprises a translator 36 receiving two inputs: a setup control file 37 and a stream of source test data 35. The form of translator 36 used in the invention is different from conventional translators 22, as is the portions of the test data used to create the test program code. The setup control file 37 is used to tailor the test program to the target ATE platform.

The setup control file 37 can come from an existing previously-created data file or can be created by a test engineer, who selected setup parameters on a setup control mechanism 38. In the preferred embodiment, the setup control mechanism 38 includes a graphical user interface (GUI). The selected parameters are stored in a setup control file 37. The selected parameters include the target ATE, character mapping definitions, output format controls, and pattern row repeat identification. The setup control mechanism 38 and setup control file 37 are described further below in section 2.0.

The stream of source test data 35 can come from one of two sources. It can come from a first source 29, which is a parser program 34 which parses one line of data at a time from an existing test data file 33. Or, in the preferred embodiment, it can come from a second source 31, a test data generation program 30 such as an ATPG or design simulation program, which has linked into it a series of interface routines 32 that stream a source test data 35 to the translator 36 as the test data generation program 30 generates source test data. The subsystem for streaming source test data 35 into the translator is described further below in section 3.0.

The translator 36 generates a test program 12 simultaneously as the source test data is fed in. Typically, the test program is executable code operable on an ATE, though other formats are possible. This invention may use multiple translators or instances of the translator 36 to produce multiple test programs from the same source test data inputs simultaneously, using different sets of data in the setup control file 37. The translator 36 is described further below in section 4.0.

2.0 Setup Control

The setup control mechanism 38 allows the user to define the contents of the setup control file 37. The setup control mechanism 38, in the preferred embodiment, utilizes a graphical user interface (GUI). The selection can also be done by any variety of user input methodologies, such as a conventional User Interface(UI) or inputting a list of settings. Once the user has defined the system setup file, that file may be stored and reused or revised in future test program generations. Section 2.1 lists and describes the typical contents of the setup control file 37.

2.1 Contents of the Setup Control File

Figure 6:
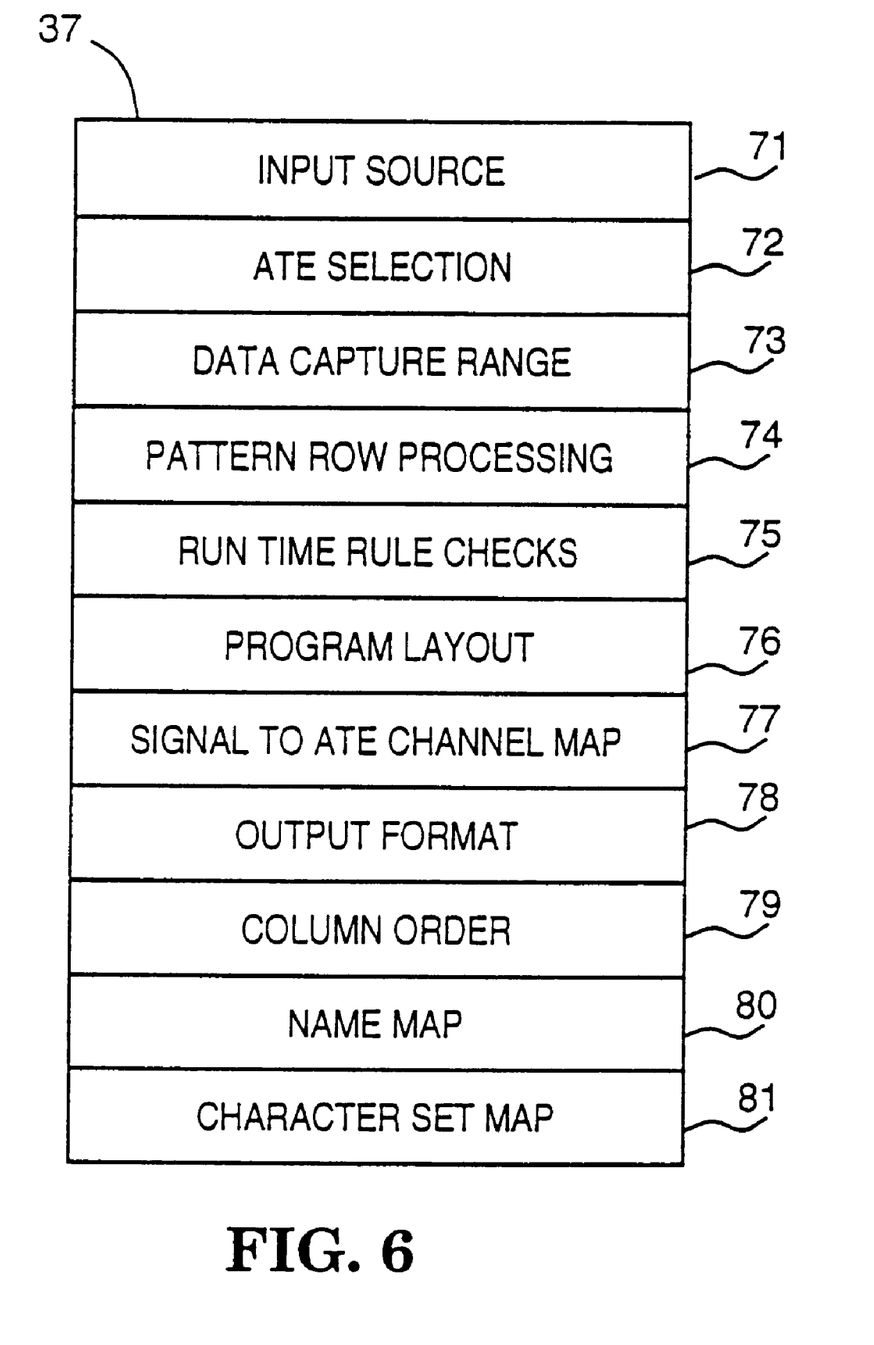
FIG. 6 is a diagram showing the functional contents of the setup control file of FIGS. 3 and 4.

The setup control file 37 is used by the translator 36 to transform the source test data 35 into a test program 12 that will operate on the specified ATE platform 11 as well as have the characteristics desired by the user. FIG. 6 shows the functional contents of the setup control file 37. Each functional parameter is described further below.

2.1.1 Input Source 71

Referring to FIG. 6, the user can specify the input source 71 of the source test data 35 (FIG. 3). The user specifies that the source test data 35 comes from either a test data generation program 30, such as an ATPG or design simulation program, or that the data comes from an existing test data file 33, such as an ASCII file. The default input source 71 is a test data generation program 30. If the input source is an existing test data file 33, the user must also identify the name of this file.

2.1.2 ATE Selection 72

The user can define the ATE selection 72, comprising the ATE family and model. The selections available to the user are based on the ATE definition files 39 available to the setup control mechanism 38 (FIG. 3). ATE definition files 39 are user editable ASCII files which contain the model identification and rules to be applied for that model.

2.1.3 Data Capture Range 73

The user can select a data capture range 73 defining a subset of all the source test data 35 to be translated. This allows for short trial runs of the translation process as well as allowing the user to select segments of the source test data 35 to translate at any one time. The user defines a start and stop range. Source test data 35 is fed to the translator 36 either in parallel rows at a time or serial scan chains on a per signal basis. Since the source test data 35 does not necessarily contain any timing information, the start and stop range is based on a row counting mechanism. Only the parallel rows are counted, with the first row being row one. The default setting of the data capture range 73 is "empty" indicating that no start or stop range is in effect.

2.1.4 Pattern Row Processing 74

The user sets the desired Pattern row processing 74, consisting of two parameters which determine how pattern row data is processed. The two parameters are serial to parallel conversion and repeat identification. If both are set, the serial to parallel conversion will be performed first.

Serial to parallel conversion is a Boolean operator indicating if the translator 36 should convert serial data into parallel data. The default for serial to parallel conversion is False. Since serial rows are specified on a per signal basis, the conversion occurs when all the serial rows have been read in and the next parallel row is found. Data values for the non-serial rows are filled in from the last parallel row before the serial data started.

Repeat identification instructs the translator 36 to identify repeat pattern rows. Repeat pattern rows are adjacent, have exactly the same pattern data and have the same waveset name. If repeat pattern rows are detected, only one row is passed to the test program 12 with a count of the number of times it is duplicated. Repeat identification has two parts: an activation setting which turns on the detection and a range setting, giving a minimum and maximum value, designating a range of repeat values to be consolidated into one row of data passed to the test program 12. The translator processing based on the parameter is described below in section 4.1.3.2.

2.1.5 Run Time Rule Checks 75

During run time translation, the source test data 35 translated by the translator 36 may exceed the capabilities of the ATE 11. Translation will continue, but the user will get an on-screen warning message and all warnings will be sent to a report file. These warnings are issued based on the run time rule checks 75. These are ATE specific and default values are based on the ATE selection 72. The user may change the run time rule checks values 75. The run time rule checks include the following values:

1. Parallel Vector Maximum: The maximum size for a parallel vector for a particular ATE.
2. Scan Chain Length Maximum: The maximum size of any one scan chain.
3. Total Scan Serial Memory: The maximum size of the sum of the scan chains entered into scan memory.
4. Scan Signal Maximum: The maximum number of scan signals which can be active at any one time. It is calculated by counting the number of scan signals found between parallel pattern rows.

2.1.6 Program Layout 76

The user can direct the translator 36 to produce one or several test programs 12. The user can also specify which of several test program elements will be contained in each test program 12. The specification of the number and format of the test program files is found in the program layout 76.

2.1.7 Signal to ATE Channel Mapping 77

The user can define the signal to ATE channel mapping 77. Most ATEs 11 define the order of the pattern column data in the pattern file preceding the pattern data. The order of the pattern column data is typically a list of ATE channel names, but can also be ATE channel numbers. The signal names generated by the ATPG program 30 will often not be compatible with the requirements of the ATE 11, therefore the user may define the mapping from a signal to a ATE channel name or number. This mapping comprises the following:

1. Signal Name—the name of the signal to be remapped.
2. ATE Channel Name—the channel name to which the signal is remapped. This shall default to the Signal Name.
3. ATE Channel Number—the channel number to which the signal is remapped. This will have no default settings.
4. Direction—A value of in or out, this may be useful for additional checks. It must be set by the user and should default to no value.
5. Scan/Normal—The user can select a pin to be defined as either scan or normal, which will allow the pin channel number to be checked against the legal ranges. Default is normal.

2.1.8 Output Format 78

The output format 78 is a series of user-defined parameters directing which way the translator 36 will format the test program 12. These parameters are:

1. Comment labels—Vertical name labels of the signal groups displayed above the data columns in the test program 12.
2. First Line Label—If enabled, the user can attach a label to the first pattern row. Default is off.
3. Last Line Label—If enabled, the user can attach a label to the last pattern row. Default is off.
4. Line Wrap and Number—If Line Wrap is enabled, the pattern data will be formatted to wrap at the designated Number. Line wrapping only occurs at legal places in the line, typically spaces.

2.1.9 Column Order 79

The user can designate the column order 79, directing the translator 36 to group and reorganize columns of pattern data in the test program 12.

2.1.10 Name Map 80

Name mapping allows the user to replace original timeset, edgeset and format set names in the source test data 35 with a custom name. The user-defined names are in the name map 80 parameter of the setup control file 37. The translator 36 substitutes the custom name for the original name when generating the test program. Though this process can be done after the translation, it can be done most efficiently during the translation. This feature is important when multiple sets of pattern data are translated, because it allows the output files to use compatible names independent of input names.

Two types of name mapping are supported: Waveset name mapping and IDDQ name mapping.

1. Waveset Name Mapping. Each pattern row generated by a test data generation program 30 must have a label, called the waveset name, associated with it indicating the type of timing or format information to use. The waveset name label is typically defined separate from the ATPG run. To allow for changing of this label during translation, the user may define a simple two column table to replace the original waveset name with a custom waveset name. For some ATEs, the user may need to define multiple names for each original waveset name. For example, the LTX micromaster has format and timing names on each row. The two column table can still be used, with the second column containing both the custom format waveset name and custom time waveset name.

2. IDDQ Name Mapping. The user can define a custom name to be placed in the OpCode field of a pattern row of the test program 12, identifying the pattern row as an IDDQ pattern row, allowing the user to define how the IDDQ test will be run.

2.1.11 Character Set Map 81

A few ATEs 11 (e.g., LTX Synchromaster, LTX Micromaster Series, the MachII mode on the J971) and at least one target output format (STIL), allows for user-programmable character definitions in the pattern data. These character definitions allow the user to embed format data into pattern data. The user can define one or more character sets in the setup control mechanism, up to one for each pin signal of a pattern data type. Each column in a unit of pattern data corresponds to an ATE pin, so that column is the pin signal. Each unit of pattern data is of a pattern data type such as read, write or idle. The user may also define character sets to remap a particular pin signal for any type of pattern data. The character set map parameter 81 of the setup control file 37 comprises a table of character sets and the character sets themselves.

Figure 7:
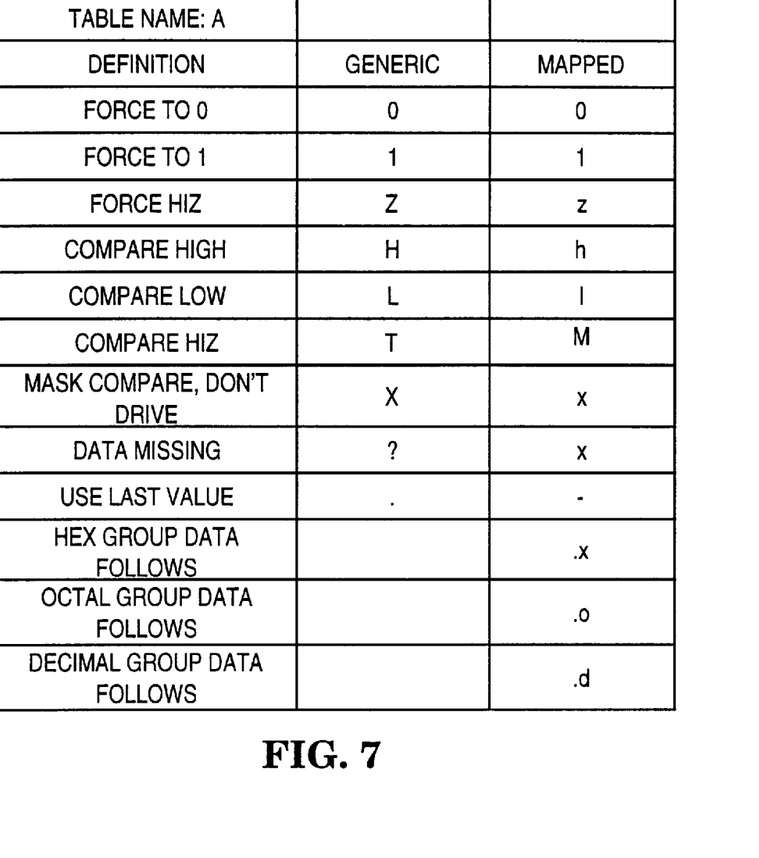
FIG. 7 shows a sample character set stored in the character set map block of FIG. 6.
Figure 8:
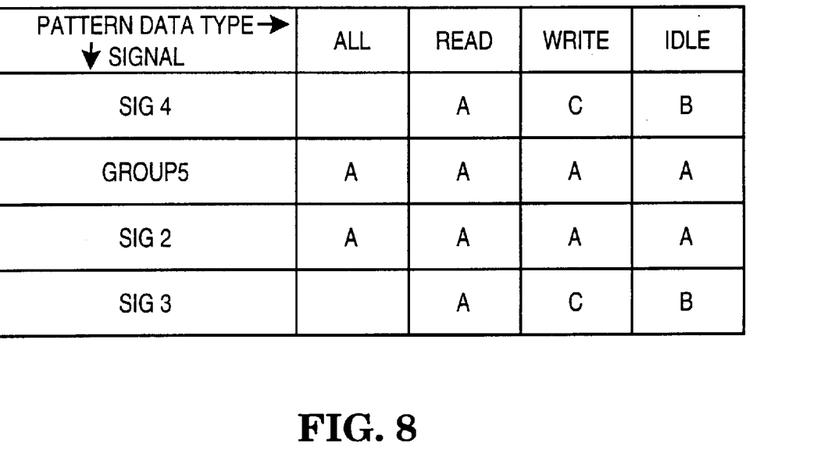
FIG. 8 shows a sample table of character sets stored in the character set map block of FIG. 6.

Each character set comprises a table defining a character and its substitution. Each character set will be identified by a letter character. These character sets may have default values for a particular ATE. FIG. 7 shows a sample character set. FIG. 8 shows a sample table of character sets. The pin signal and the pattern type of a character of pattern data may have a character set defined for it. If it does, the character of pattern data is remapped according to the character set. See section 4.1.3.4 below for an example of remapping according to a character set. This process can take place with the parser on one computer and the translator on another, thereby speeding up the overall process.

3.0 Generation of Input Stream 3.1 Origin of Data

Referring back to FIGS. 3 and 4, the test data used in this invention can come from one of two sources, either a test data generation program 30 or an existing test data file 35.

The invention allows for data to be sent directly to the translator as it is generated by a test data generation program such as an ATPG or a design simulation program. This invention provides software routines (the interface routines 32) to a commercial test data generation program to link as part of their program. When the test data generation program utilizing the interface routines is run, the source test data output is streamed serially to the translator. The interface routines mark the significant source test data as it is sent to the translator. In an optimal setup, the data is streamed using a high speed data link to another computer, as the test data is generated.

The user may wish to create a test program from an existing test data file. This file will typically be an ASCII file in a waveform format such as WGL or STIL. By use of a parser 34, the data in the existing test data file is streamed to the translator in such a way as to look to the translator like the data is coming from a test data generation program. The significant data is marked the same way and it is serially streamed the same way.

3.1 Interface Routines 32

Embedded in the test data generation program 20 are interface routines which mark the significant data and serially stream it to the translator 36. The following are the interface routines used along with a description of the marks they make to the source test data streaming to the translator.

1) 'Start': marks the beginning of the source test data to the translator and must precede all other function calls. It insures that the proper remote process is set up and opens up the data path.

2) 'Parallel Setup': marks the beginning of the parallel (or pattern) data section. It must precede any parallel row data. It defines the order of the data bits for pattern data.

3) 'Parallel Row Data': marks one row of pattern data and streams it to the translator. The order of data bits must match the definition in the parallel setup, or a run time error results. A parallel row data call may include a mark associating special characteristics with a pattern row, such as marking the pattern row as a IDDQ test candidate.

4) 'Serial Setup': marks the beginning of data (typically scan signals) represented in a serial form.

5) 'Serial Data': marks one signal of serial data (typically one scan chain).

6) 'Program End': marks the end of data, allowing for a graceful termination of the translator.

3.2 Parser function 34

The parser 34 streams data from an existing data file to the translator in the same way that the interface routines stream data from a test data generation program. The parser inserts the same marks in the source test data as the interface routines and streams the data to the translator, one unit of source test data at a time, in the same way that the interface routines stream data to the translator.

4.0 Translation to Output

The invention can generate more than one test program from the same source test data and setup control file. The test programs may be operable on an ATE (an ATE program) or used elsewhere in the testing process(target output program). The following scenarios are examples where more than one test program may be useful.

1) The user may generate both an ASCII version of the test program and an ATE executable program. The ASCII version can be used for visual inspection and the ATE program used for loading and execution onto an ATE.

2) The user may generate both simulation vectors and an ATE executable program. The simulation vectors can be used to re-simulate the circuit with the translator results while the ATE program tests the actual circuit.

3) The user may generate both an intermediate "check-off" format and an ATE executable program.

A separate translator process runs for each desired test program.

4.1 The Translator

FIG. 3 shows the translator's place in the overall layout of this invention. A translator takes as input a stream of source test data 35 and a setup control file 37 and generates as output a test program 12.

Figure 5:
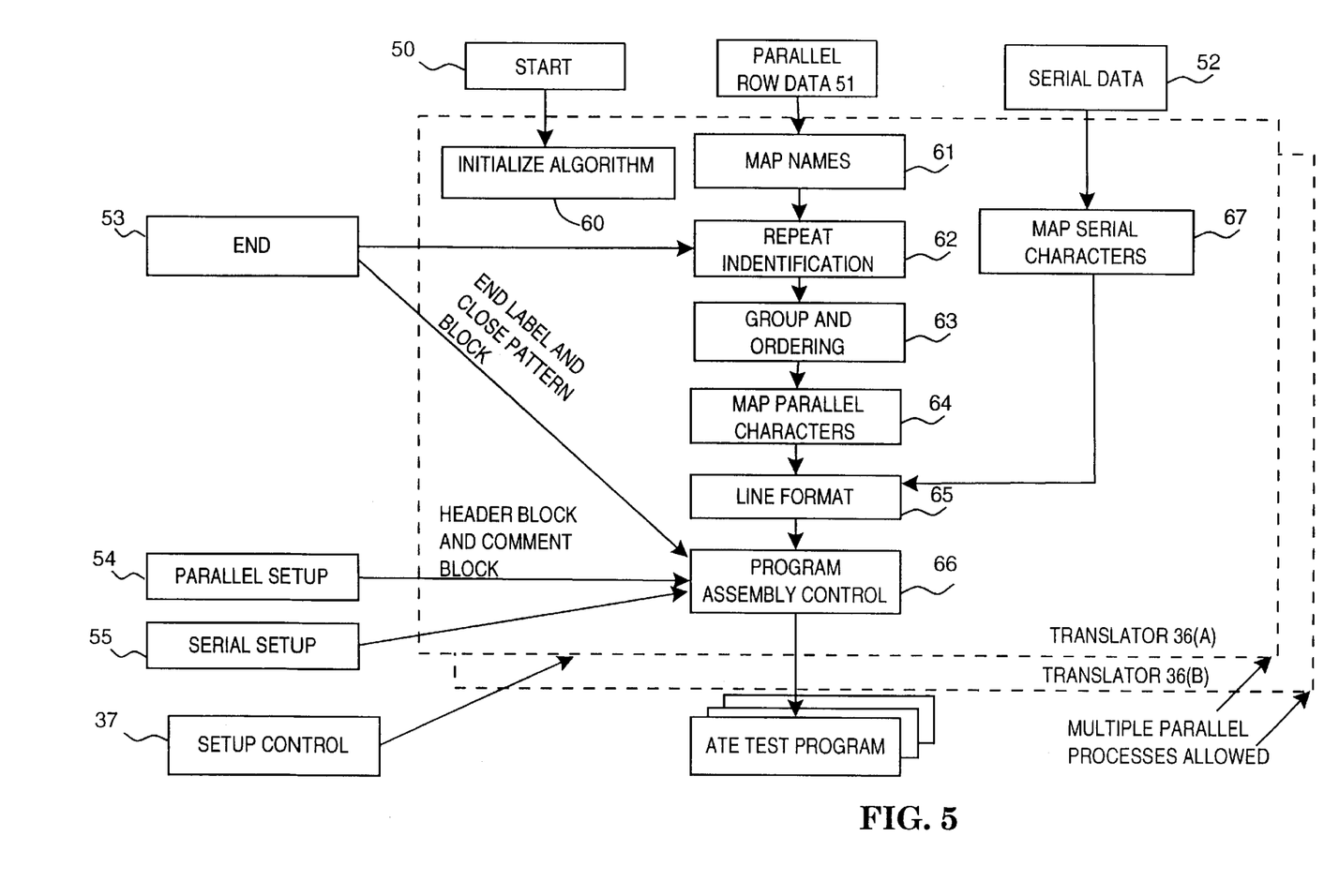
FIG. 5 is a detailed flow diagram of the translation process according to the present invention.

FIG. 5 is a detailed block diagram of the translation process according to the present invention. The interface routines split the data flow into segments which are directed to different parts of the algorithms. The translator operates only on source test data 35 marked as 'start' 50, 'parallel setup' 54, 'parallel row data' 51, 'serial setup' 55, 'serial data' 52 and 'end' 53. The translator operates on the specific type of source test data as described in each of the following sections. Many of the functions within the translator use the Setup Control File 37. FIG. 5 indicates the setup control file 37 being used generally by the entire translator. How functions use the setup control file 37 is described for each relevant functions below.

4.1.1 Start 50

For source test data marked as start 50, the translator performs the 'initialize algorithm' function 60, initializing the translation process.

4.1.2 Parallel Setup 54

For source test data marked as Parallel Setup 54, the translator prepares for parallel data as input. It contains header block and comment block information that is passed to the test program using the 'program assembly control' function 66.

4.1.3 Parallel Row Data 51

For source test data marked as Parallel Row Data 51, the translator performs several steps, including buffering of the data, before the information contained in the data is output to the test program.

The first step is to remap the name of the parallel data row, if necessary, using the 'Map Waveform Template Names' function 61. The data is then passed to the 'repeat identification' function 62 which looks for repeat values in the parallel data. When all the consecutive repeat values are found, the data is then grouped according to the setup control file in the 'grouping and ordering' function 63. The characters of the data can be remapped according to the character sets defined by the user, if appropriate, using the 'map parallel characters' function 64. The output line of test code is formatted according to the selected test program format in the 'line format' function 65. The data is output to the test program using the 'program assembly control' function 66.

Each of these functions is described in more detail below.

4.1.3.1 Map Names 61

The user can define custom names for parallel data, typically a waveset name, using the setup control mechanism. This information is stored in the name map parameter 80 of the setup control file 37 for use by the translator. If the parallel data name input into the translator has a corresponding new name defined in the name map parameter, the new name will be substituted for the old one by the 'map names' function 61.

4.1.3.2 Repeat Identification 62

The user can request that the translator recognize repeat parallel data and output only one unit of this data along with a count of the number of units of data repeated. This repeat identification flag is found in the pattern row processing parameter 74 of the setup control file 37. The translator detects repeat parallel data in the 'repeat identification' function 62. If the repeat identification flag is set, each unit of parallel data is compared to the previous unit of parallel data. The two units are compared for identity in contents and waveform sheet reference. If the two units are identical, the repeat count is incremented. If the two units of data are different or if the end of parallel data is detected, the buffered data is passed to the next step in the process along with a count of the number of repeated units of data. If the two units of data are different or this is the first unit of parallel data, the new parallel data are buffered for comparison to the next data unit.

4.1.3.3 Grouping and Ordering 63

The user can control the re-ordering of pattern data, the grouping of data associated with more than one ATE pin, and the assignment of a radix (hex, decimal, binary, or octal) to a group of data. The user selects his choices for the ordering and grouping on the setup control mechanism which is available to the translator in the column order parameter 79 of the setup control file 37. In the 'grouping and ordering' function 63, the input buffered data is reorganized according to the setup control file and passed to the next step in the process.

4.1.3.4 Map Parallel Characters 64

Some test program formats allow for user programmable character definitions in the pattern data. These character definitions allow the user to embed format data into pattern data on some ATEs. Alternatively, this mapping control allows for the override of existing data or a signal or the creation of a signal and corresponding data values. The user can define one or more character sets in the setup control mechanism, up to one for each pin signal of a pattern data type. The user can also define character sets to remap a particular signal pin for any type of pattern data. These definitions are available to the translator in the setup control file 37.

The 'map parallel characters' function 64 maps the parallel data according to the character sets defined in the setup control file. FIG. 7 shows an example of a character set. FIG. 8 shows an example of a table of character sets, with each entry of the table potentially pointing to a character set such as the one shown in FIG. 7. If, for example, the unit of parallel data is a unit of 'read' data and signal 4 is a 'Z', then a lookup of the table in FIG. 8 would indicate that character set 'A' should be used to remap the character. A lookup of the character set in FIG. 7 shows that a 'Z' should be remapped to 'z'.

The two sets of tables allow the user to define a remapping for any signal pin of any pattern data type. A good method to optimize this process for speed is to have the links for each character set stored in a calculated lookup table at the start of the processing.

4.1.3.5 Line Format 65

The parallel row data 54 is formatted in the 'line format' function 65 according to the user's choice of test program format found in the ATE selection 72 and output format 78 parameters of the setup control file 37. The format information for each test program format is available to this function as a data structure.

4.1.3.6 Program Assembly Control 66

Data is written to the test program output file in the 'program assembly control' function 66. For test programs that will be run on an ATE, any data needed by the test program not passed in as source test data are integrated here to produce a test program that is operable on the ATE.

4.1.4 Serial Setup 55

For source test data marked as Serial Setup 55, the translator prepares for serial data 52 as input. It contains header block and comment block information that is passed to the test program using the 'program assembly control' function 66.

4.1.5 Serial Data 52

For source test data marked as Serial Data 52, the translator remaps characters of serial data using the 'map serial characters' function 67. The process is the same as the 'map parallel characters' function 64 described in section 4.1.3.4 above. The serial data then proceeds to the 'line format' function 65 and proceeds as described in section 4.1.3 above. In the pattern row processing parameter 74 of the setup control file 37 is the serial-to-parallel conversion flag. If this flag is true, a plurality of units of serial data will be converted to a unit of parallel data and the parallel row data 51 functions will be performed on the parallel data.

4.1.6 End 53.

For source test data marked as End 53, the translator finishes up the translation process. It processes any data held in the buffers by a call to the 'repeat identification' function 62. This call moves the buffered data onto the next step in the process, 'group and ordering' 63, and proceeds as described in section 4.1.3 above. It also generates a termination line for the test program using the 'program assembly control' function 66.

4.2 Output

This invention has the ability to generate multiple ATE files at the same time from the same data being fed by the run-time translator. Cases where this might be desirable include:

1. The generation of ASCII and binary-executable versions of the test program at the same time, in the case where the ASCII is created for visual inspection and the binary is directly loaded on the ATE;
2. The generation of simulation vectors along with a test program to allow a re-simulation of the results; or
3. The generation of an intermediate "check-off" format and an executable test program at the same time.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A system for automatically converting source test data for a designed electronic device into a test program compatible with a selected target ATE platform for testing the designed electronic device, the system comprising:

a translator, a setup control mechanism for inputting setup control parameters, the setup control parameters including the selection of the target ATE platform, means for streaming units of the source test data to the translator, the translator including:

means for transforming the source test data into test code conforming to the setup control parameters; and means for outputting the test code to the test program, the test program operable on the selected target ATE platform.

2. A system according to claim 1, in which the streaming means further includes means for generating source test data.

3. A system according to claim 1, in which the transform means is operable to accept a unit of the source test data at a time.

4. A system according to claim 1, in which:

the streaming means further includes means for generating source test data, the transforming means is operable to accept a unit of the source test data at a time, and the generating means operates simultaneously with the transforming means.

5. A system according to claim 1, in which:

the source test data includes scan data, pattern data, and timing data, and the transforming means further includes means for converting the scan data and the pattern data into test code conforming to the setup control parameters.

6. A system according to claim 1, in which:

the source test data includes scan data, pattern data, and timing data, and the streaming means further including:

means for marking the scan data; and means for marking the pattern data.

7. A system according to claim 6, in which:

the streaming means further includes means for generating source test data, and the means for generating source test data comprises a test data generation program, the test data generation program including the marking means.

8. A method for automatically converting source test data for a designed electronic device into a test program compatible with a selected target ATE platform for testing the designed electronic device, the method comprising:

inputting setup control parameters to select the target ATE platform, streaming units of the source test data into the translator, transforming the source test data into test code conforming to the setup control parameters, outputting the test code to an ATE test program file, the test program file operable on the selected target ATE platform.

9. A method according to claim 8, wherein the step of streaming the source test data into the translator includes the step of simultaneously generating source test data.

10. A method according to claim 8, in which the step of transforming is operable to accept a unit of the source test data at a time.

11. A method according to claim 8, in which:

the step of streaming the source test data into the translator includes the step of generating the source test data;

the step of transforming includes accepting a unit of the source test data at a time; and the step of generating source test data and the step of transforming run concurrently.

12. A translator operable on a computer to translate source test data into test code operable on a target ATE platform, the translator comprising:

means for receiving a unit of source test data at a time, means for reading a file, the file comprising setup control parameters, the setup control parameters including a selection of the target ATE platform, means for transforming the source test data to test code in accordance with the setup control parameters, means for outputting the test code to a test program, the test program operable on the target ATE platform.

13. A translator according to claim 12, in which the setup control parameters further include format characteristics; and the transforming means include a means for formatting the source test data into test code according to the format characteristics.

14. A translator according to claim 13 in which format characteristics include:

data capture range, pattern row processing, program layout, signal to ATE channel map, output format and column order.

15. A translator according to claim 12, in which the transform means includes a means for buffering a plurality of units of source test data to allow for transformation of a group of test data into test code.

16. A translator according to claim 15, in which:

the setup control parameters further include one or more tables of characters, each table corresponding to a pin signal for a pattern data type; and the transforming means includes a means for formatting the buffered source test data according to the one or more tables of characters.

17. A system for automatically converting source test data for a designed electronic device into a plurality of test programs, each test program compatible with a selected test program format, the system comprising:

a plurality of translators, means for inputting source test data into the translators, a setup control mechanism for inputting setup control parameters, the setup control parameters including the selection of at least one of a plurality of test program formats, each translator including:

a means for transforming the source test data into test code conforming to the setup control parameters; and a means for outputting the test code to a test program formatted in a selected one of the test program formats.

18. A system according to claim 17, in which the input means comprises a means for streaming units of the source test data to each translator.

* * * * *